(12) United States Patent
Ter Meulen et al.

(10) Patent No.: US 10,996,559 B2
(45) Date of Patent: May 4, 2021

(54) METHOD FOR TEXTURING DISCRETE SUBSTRATES II

(71) Applicant: Morphotonics Holding B.V., Veldhoven (NL)

(72) Inventors: Jan Matthijs Ter Meulen, Eindhoven (NL); Bram Johannes Titulaer, Veldhoven (NL); Adrianus Johannes Van Erven, Casteren (NL)

(73) Assignee: Morphotonics Holding B.V., Veldhoven (NL)

( * ) Notice: Subject to any disclaimer, the term of this patent is extended or adjusted under 35 U.S.C. 154(b) by 252 days.

(21) Appl. No.: 15/549,419

(22) PCT Filed: Feb. 11, 2016

(86) PCT No.: PCT/EP2016/052872
§ 371 (c)(1),
(2) Date: Aug. 8, 2017

(87) PCT Pub. No.: WO2016/128493
PCT Pub. Date: Aug. 18, 2016

(65) Prior Publication Data
US 2018/0017862 A1   Jan. 18, 2018

(30) Foreign Application Priority Data

Feb. 13, 2015   (EP) ................................. 15155039

(51) Int. Cl.
*G03F 7/00* (2006.01)
*B30B 11/20* (2006.01)

(52) U.S. Cl.
CPC ............ *G03F 7/0002* (2013.01); *B30B 11/20* (2013.01); *B29C 2791/006* (2013.01)

(58) Field of Classification Search
CPC .. G03F 7/0002; B30B 11/20; B29C 2791/006
See application file for complete search history.

(56) References Cited

U.S. PATENT DOCUMENTS

2011/0129956 A1    6/2011  Polito et al.
2016/0250875 A1*   9/2016  Tarnowski ........... H05K 3/1275
                                                        345/173

FOREIGN PATENT DOCUMENTS

EP           2476538 A2    7/2012
WO    WO 2007/132320 A2   11/2007

* cited by examiner

*Primary Examiner* — Jacob T Minskey
*Assistant Examiner* — S. Behrooz Ghorishi
(74) *Attorney, Agent, or Firm* — Hammer & Associates, P.C.

(57) ABSTRACT

A roll-to-plate process comprising at least one roll for texturing or patterning discrete substrates, such as displays, lighting or solar panels comprising the steps of supplying an imprinting lacquer in the shape of a continuous layer, texturing the imprinting lacquer with a mold having a rear side and a front side, wherein the rear side is in frictional contact with the at least one roll, and wherein the front side exhibits an imprint texture comprising a functional area which functional area is formed by openings and elevations thus creating volumes in the imprint texture to obtain an imprinted lacquer and optionally followed by curing the imprinted lacquer to obtain a solidified textured or patterned layer, characterized in that the texturing or patterning is performed with an imprint texture that comprises a starting area which is a lead-in area with a texture for which gas can escape followed by the functional area with a texture which is different from the texture of the lead-in area.

17 Claims, 3 Drawing Sheets

METHOD FOR TEXTURING DISCRETE SUBSTRATES II

FIELD OF THE INVENTION

The invention pertains to a method for texturing or patterning discrete substrates, such as displays, lighting or solar panels, by imprinting an imprinting lacquer with a stamp, followed by curing of the imprinted lacquer, resulting in an additional functional textured layer on the discrete substrate. The function of this additional layer can amongst others vary from a light management layer to a hydrophobic layer, decorative use or use in biosensors. The invention further pertains to a stamp that imprints the lacquer to texture or pattern the discrete substrates. The use of functional textured layers on devices is an important topic. The smart usage of such layers can enhance performance, reduce cost or improve the visual appearance of the product. For example diffusing layers are used in displays, enabling the use of thinner LED backlight concepts and illuminating the display from the sides. Other new high tech possibilities are the integration of functional textured layers into solar panels improving their efficiency or integration in organic light-emitting diode (OLED) lighting panels to extract more light.

BACKGROUND OF THE INVENTION

Functional textured layers can be made by use of imprint lithography. In this case the substrate, or mold, or both sides are coated with a lacquer (resin or resist). After pressing the mold on the substrate with lacquer in between, the textured lacquer is cured to a solid phase. The curing method can be thermal or by use of UV light. Already in 1978 this technology was mentioned in U.S. Pat. No. 4,128,369. Further pioneer work was done by Chou in 1995. He demonstrated that by use of a rigid stamp sub-25 nm textures could be replicated in high throughput mass production (U.S. Pat. No. 5,772,905) or in an article by Stephen Y. Chou, Peter R. Krauss, Preston J. Renstrom (Appl. Phys. Lett. 67 (1995) 3114-3116). Later-on the use of a roller to apply pressure on either a rigid mold or a bended thin metal sheet to replicate textures was demonstrated (article Hua Tan, Andrew Gilbertson, Stephen Y. Chou, J. Vac. Sci. Technol., B 16 (1998) 3926-3928).

Many institutes and companies continued this work, resulting in different techniques.

In the semiconductor industry plate-to-plate imprinting is applied by using a rigid stamp in combination with a transfer process, materials and precise positioning as described in U.S. Pat. No. 6,334,960, US Patent Application 2004/0065976 and U.S. Pat. No. 8,432,548.

The roll-to-roll imprinting technique uses textured rollers in combination with flexible substrates to texture foils or films in a continuous process as described in e.g. the U.S. Pat. No. 8,027,086.

The first mentioned plate-to-plate technique is designed for the precise, wafer-scale, imprinting of small textures (resolution in sub-100 nm) on uniform flat wafers with high position accuracy. But as described in the Chinese Patent Application CN 103235483, this technology is difficult to scale to lager areas.

By use of the roll-to-roll technology textured foils can be made continuously at high production speeds. These foils can be used as substrates for flexible applications or can be laminated to rigid substrates. However the latter comes at additional costs of an intermediate adhesive layer to adhere the textured foil to the rigid substrate or product. Therefore a third new technology is being developed: direct roll-to-plate imprinting. Hereby the functional textured layer is directly applied on the discrete substrate without intermediate thick adhesive layers of tens to hundreds of micron thickness. In such processes either a textured roller, as exemplified in the French Patent 2,893,610 or a removable flexible stamp is used, as disclosed in U.S. Pat. No. 7,824,516.

In contrast to the continuous roll-to-roll process, the challenges of the discontinuous roll-to-plate process are start-stop effects. An additional challenge compared to the roll-to-roll process as well as the plate-to-plate process is the fact that the textured surface is typically not cut back into smaller samples in the roll-to-plate process. Therefore the full sample, including the edges of the samples, has to be made well controlled in the roll-to-plate process without such post-processing.

As already mentioned in the introductory paragraph the imprinting is achieved by coating either a lacquer onto a substrate (panel) or on the mold and imprinting (texturing) it by contacting the mold and the substrate with lacquer in between. As mold either a flexible stamp, rigid stamp or a textured roller can be used. Coating can be done in various ways, such as—but not limited to—dispensing, ink-jet printing, screen printing, jetting, spraying, slot-die coating or roll-coating the lacquer onto the substrate or stamp.

In the course of the invention with the term "lacquer" a substance is meant that can be coated onto a substrate and textured (imprinted) by methods known to those skilled in the art. The lacquer usually comprises monomers, oligomers, with possibly added photo-initiators and crosslinking acrylate groups. Other possible materials are—but not limited to—curable sol-gels and epoxies. The lacquer is capable of being cured to retain the imprinted pattern. These curing processes are also known and encompass thermal curing, curing by UV light, chemically induced curing and other methods known per se. Such lacquers are also referred to as coatings, resins, resists and the like.

Also, in the course of this invention the items that are being imprinted with the lacquer are referred to as substrates or panels. These substrates or panels can be sub-assemblies as for instance glass, plastic or metal substrates or can be finished devices as displays, lighting or solar panels.

The texturing of discrete panels or substrates by the roll-to-plate imprinting process is discontinuous. For each panel there will be a start-stop moment. The start of this process has several challenges. The substrate has to be placed underneath of the mold. In the roll-to-plate process the substrate is horizontally slided underneath of the roller with flexible mold. Because this is a discontinuous process for each substrate there will be a first contact between mold and imprint lacquer placed on the substrate. Due to the textures on the mold, gas will be trapped in between the textured mold and the lacquer in the first contact area. For textures with distinct channels, like lenticulars, entrapped gas, can escape to the sides. For most 3D textures, especially inverted 3D textures and random 3D textures, the entrapped gas, or air for most applications, cannot escape. This will result in an incomplete replication of the texture. This will cause at least a partial loss of the functionality of the texture and can also be visually unappealing. In the discontinuous plate-to-plate process this problem is solved by including a vacuum step. In the ambient roll-to-plate process no vacuum step is applied. Air inclusion has to be solved by adjustment of the texture.

WO 2007/123805 A2 describes a lithographic imprinting system to create and maintain a desired environment in the vicinity of a nano-imprint lithography template by creation of a partial vacuum using channels or holes in the template holding the nano-imprint mold.

WO 2007/132320 A2 describes a nanoprint lithography template including inter alia an mold and explains in paragraph [0041] that the mold contacts droplets of a polymeric material. This causes the droplets to spread and to produce a contiguous liquid sheet of the polymeric material. The sheet of polymeric material is surrounded by remaining droplets. The volume between the remaining droplets defines gas passages through which gas may be pushed to the edges of the substrate. The edge of the liquid sheet defines a liquid-gas interface that functions to push gases in the volume between the remaining droplets toward the edges of the substrate. As a result, the liquid-gas interface in conjunction with the gas passages reduces, if not prevents, trapping of gases in the liquid sheet of polymeric material.

EP 1 958 025 B1 describes a plate-to-plate imprinting process of polymeric material between a substrate and a mold assembly. The process uses a mold assembly which is in permanent contact with a chuck. The mold assembly is bended by a vacuum such that gas expels from between said substrate and said mold assembly and said liquid fills a volume defined between said mold assembly and substrate.

US 2007/0228589 A1 describes a plate-to-plate imprinting process of polymeric material between a substrate and a mold assembly. The mold assembly is in permanent contact with a template chuck. The mold assembly is bended by a vacuum in multiple areas such that gas expels from between said substrate and said mold assembly and said liquid fills a volume defined between said mold assembly and substrate.

As a standard in the plate-to-plate process, vacuum is applied during the imprint process and the air inclusion problem as discussed above will not be present. However, to reduce the cost and tact time, the level of vacuum should be reduced or the vacuum step should even be eliminated. Other solutions to cope with the air inclusion have been proposed in prior art.

The Korean Patent Application KR 20130123760 proposes a camera detection system for air bubbles and will adjust the pressure and length of the vacuum step if air bubbles remain visible. This proposed solution will make the system more expensive and slow.

BRIEF SUMMARY OF THE INVENTION

Present invention seeks to reduce or prevent the problems of the prior art. This goal is achieved by a roll-to-plate process comprising at least one roll for texturing or patterning discrete substrates, such as displays, lighting or solar panels comprising the steps of supplying an imprinting lacquer in the shape of a continuous layer, texturing the imprinting lacquer with a mold having a rear side and a front side, wherein the rear side is in frictional contact with the at least one roll, and wherein the front side exhibits an imprint texture comprising a functional area which functional area is formed by openings and elevations thus creating volumes in the imprint texture to obtain an imprinted lacquer and optionally followed by curing the imprinted lacquer to obtain a solidified textured or patterned layer, characterized in that the texturing or patterning is performed with an imprint texture that comprises a starting area which is a lead-in area with a texture for which gas can escape followed by the functional area with a texture which is different from the texture of the lead-in area.

Preferred embodiments of the inventive method can be derived from the dependent claims.

For most applications the texturing process will be applied in air. Therefore air is mentioned in this application, instead of the general gas term. But the invention is also directed to texturing process that are applied in other gas conditions as for instance—but not limited to—argon, nitrogen or carbon dioxide.

The Taiwanese Patent Application TW 201036799 proposes a wide trench to the inner area along which air can escape during a full area press. This trench is placed aside of the functional areas, but not connected to the functional area. This trench will not be present on the end-product, because for semi-conductor applications the wafer is cut back to smaller pieces. The present invention solves the air entrapment problem by adjusting the texture only in a defined lead-in region, in a manner which will be visual appealing and thereby does not need to be removed. The texture in the functional area is unchanged.

The US Patent Application US20080099175 proposes a flow channel transversely connected to the micro or nano structure. Hereby air or gas can escape once the replication material is forced into the mold to replicate the micro or nano-textures. The flow channel will not be part of the end product. The present invention starts the imprint process in a lead-in area, not by a full area press. The texture in this lead-in area is altered to prevent air entrapment, in a manner which will be visual appealing and thereby does not need to be removed.

BRIEF DESCRIPTION OF THE DRAWINGS

The invention is being explained now in more detail with reference to the following Figures.

DETAILED DESCRIPTION OF THE INVENTION

Figure 1:
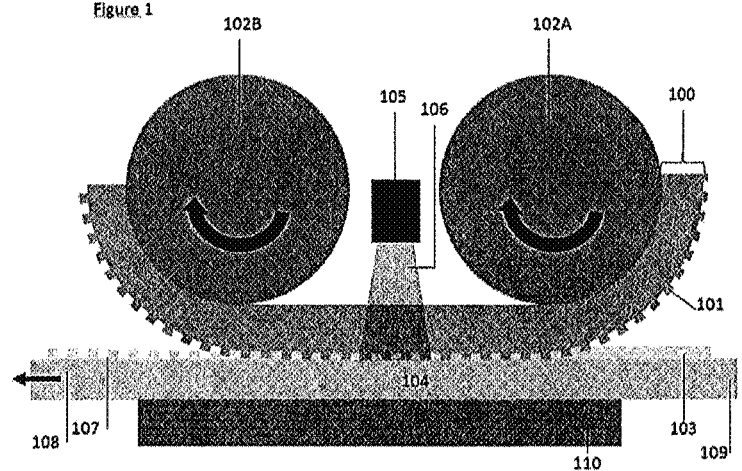
FIG. 1 schematically depicts an imprinting process.

The terms "imprint texture" and "imprint pattern" are used throughout the invention synonymously Referring now to FIG. 1 a schematic roll-to-plate imprint process is illustrated. In this case the functional imprint layer will be applied on top of a substrate 104. The substrate 104 can be any material; preferably the substrate 104 comprises or is made of glass, metal sheets, polycarbonate, PEN, PET, or PMMA. The substrate 104 may carry one or more additional layer(s) coated on top of the surface like for instance an adhesion promotion layer and/or a transparent conductor layer (e.g. indiumtinoxide, aluminum doped zinc-oxide or flour doped tinoxide). The desired imprint layer can be added on top of substrate 104 by use of a replication or imprint process. In this case the substrate 104 is coated with a formable imprint lacquer 103. The substrate is placed on platform 110 for guidance and counter pressure. This platform 110 can be one or multiple rollers, a fixed table, moving table or any other platform providing sufficient counter pressure. In FIG. 1 the mold is a flexible stamp 100.

The flexible stamp 100 has a supporting flexible stamp base and a patterned outer surface 101, also referred to as "the imprint texture" or "the imprint pattern". This imprint texture comprises a functional area which functional area is formed by openings and elevations, which for the ones skilled in the art is known as relief pattern. This relief patterned outer surface 101 is the negative (or inverse) texture of the desired texture on the substrate. The flexible stamp base 100 and the patterned outer surface can be made of one and the same material, as for instance—but not limited to—thin metal sheets or plastic sheets made by a milling or hot embossing process. The flexible stamp can also be made using two or more materials have a flexible sheet as base 100, as for instance but not limited to PET foil, PC foil, PEN foil or thin metal sheets, and an adhered textured organic layer 101, as for instance but not limited to an acrylate material, a sol-gel material, an epoxy or second textured plastic foil. Even more layers can be added to enhance robustness or functionality of the flexible stamp, as for instance an anti-stick layer.

Preferably, the flexible stamp 100 exhibits a Young's Modulus between 0.1 Giga Pascal (GPa) and 10 Giga Pascal (GPa), especially preferred between 0.5 Giga Pascal (GPa) and 5 Giga Pascal (GPa). The Young's Modulus was measured according to ASTM E111.

The flexible stamp 100 is guided over imprint rollers 102A & 102B. Note that for simplicity two rollers 102 are drawn. One roller could be sufficient or more rollers can be added to guide the flexible stamp 100. The rollers can be made of a rigid material as for instance but not limited to, stainless steel, but preferably the rollers are made of a more elastic material as for instance, but not limited to, polychloroprene, polyurethane or EPDM with a typical shore-A hardness between 50 and 60. The rotation of the rollers 102 indicates the imprint direction, shown by the arrows, starting the imprint at the beginning of the substrate 108 and ending at the end of substrate 109. An imprint lacquer 103 is supplied to the surface of the substrate 104. To transfer the texture the flexible stamp 100 with its outer surface, the imprint texture 101, having the inverse texture of the desired texture, is pressed on the substrate 104 with the imprint lacquer 103 in between. Subsequently the formable imprint lacquer 103 is solidified either thermally or by use of UV light 106 to result the solidified layer 107. In FIG. 1 the formable lacquer is solidified by use of the UV light 106 from the UV light source 105. The UV light source 105 can be placed above a transparent flexible stamp 100. Or in case the substrate 104 is transparent, the UV light source 105 can be placed opposite to the flexible stamp 100, underneath of the transparent substrate 104. In FIG. 1 the position of the UV light source 105 is in between the rollers 102A and 102B. The UV light source 105 can also be placed in one of the two rollers 102, or opposite to the rollers 102. After solidifying of the imprint lacquer 103, the flexible stamp is then separated from the solidified layer 107 on substrate 104 such that the substrate with solidified layer 107 is spaced apart from the template in the form of the stamp 100.

Figure 2A:
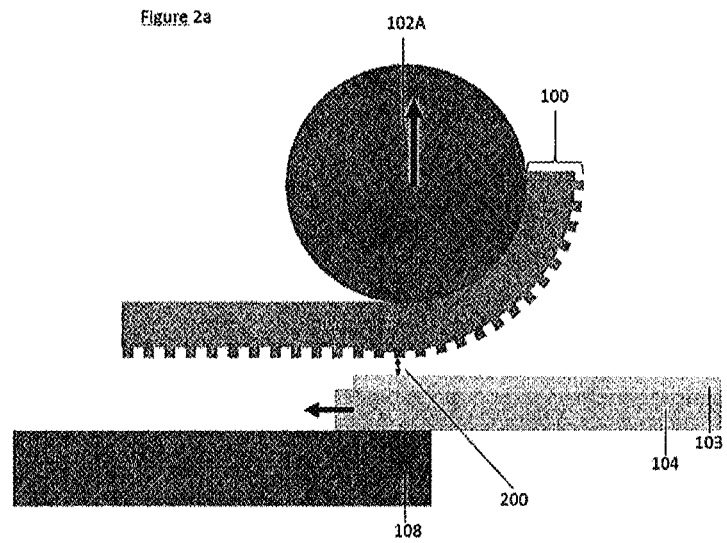
FIGS. 2a, 2b and 2c schematically depict the formation of air inclusions during the imprinting process.
Figure 2B:
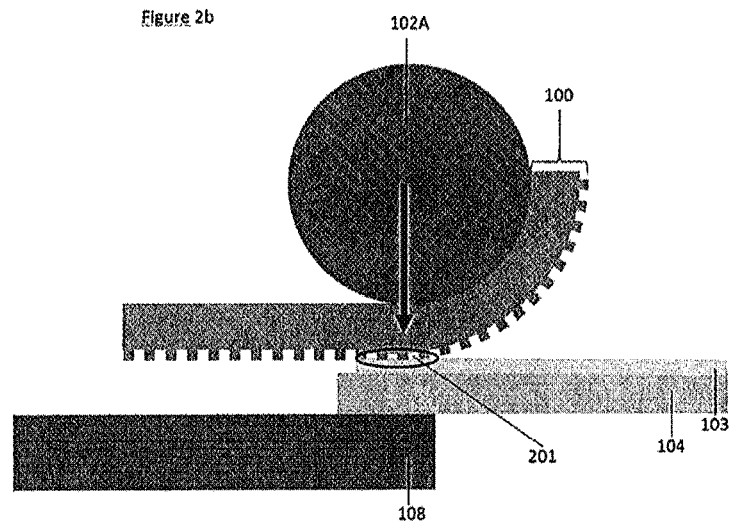
Figure 2C:
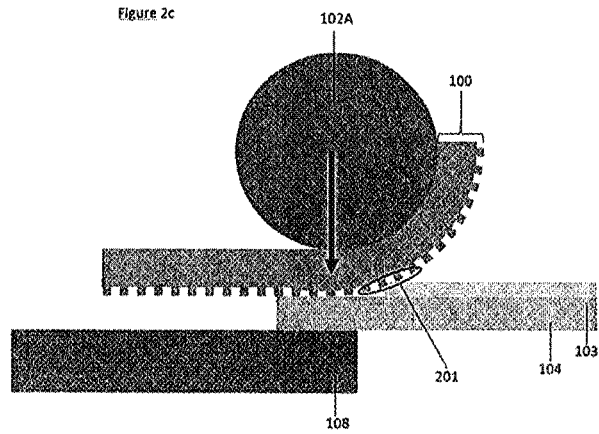

In contrast to the plate-to-plate process the substrate is mechanically moved forward underneath the mold. The gap between the rollers 102 and counter pressure platform 110 can be controlled. This means that for a fixed thickness of the substrate, the gap could be set such that the mold will only touch the lacquer and not the edge of the substrate. In practice this will be difficult, because the lacquer thickness is commonly in the micron range and the substrate thickness, commonly hundreds of microns thick, will vary. Therefore the first roller 102A can be lifted to provide an entrance gap 200 by which the substrate can enter without touching the stamp as shown in FIG. 2a. The same gap can be achieved by lowering the platform 110. After loading of the substrate the textured roller or roller with stamp is lowered again as shown in FIG. 2b. While lowering the first roller 102A, air will be entrapped in the first contact area 201 in between of the textured mold and the lacquer. In case the roller is lowered and comes in contact with the glass edges without lacquer first, as shown in FIG. 2c, air will be trapped in the same first contact area 201 during the start of imprinting the lacquer. The first contact area between mold and imprint lacquer as shown in FIG. 2c will be similar in the case the imprint gap 200 is well controlled and the roller does not have to be lowered nor lifted. Also in this case there will be air trapped at the first contact area between mold and imprint lacquer.

Figure 3A:
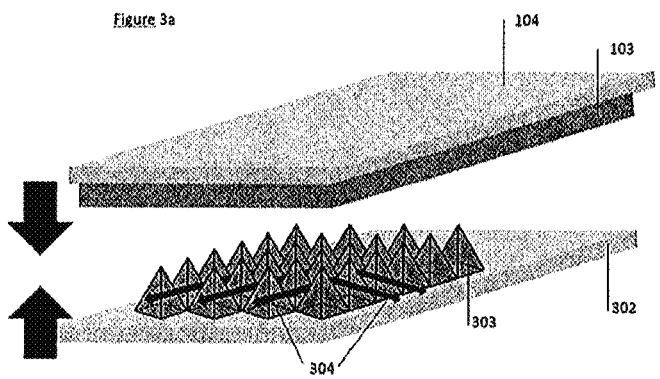
FIGS. 3a and 3b schematically depict an open channel structure and an inverted 3D texture (no air can escape)

There are certain mold textures for which the air can escape from the first contact area 201. These are textures with open channels along which the air can escape. Examples of textures with channels are 2D lenticular structures or gratings on the mold, lens-arrays and pyramids-arrays on the mold with channels in between the lenses or pyramids. An example of an open channel texture is shown in FIG. 3a. In this example a mold with pyramid array texture 303 is shown on a carrier 302. Once this mold comes in contact with the imprint lacquer 103 on substrate 104 the air trapped in between the mold and the resin can escape through the channels 304 in the pyramid array textures. Other texture for which air will not be trapped are shallow textures with a texture height below 1 micron or even a flat surface without texture.

Figure 3B:
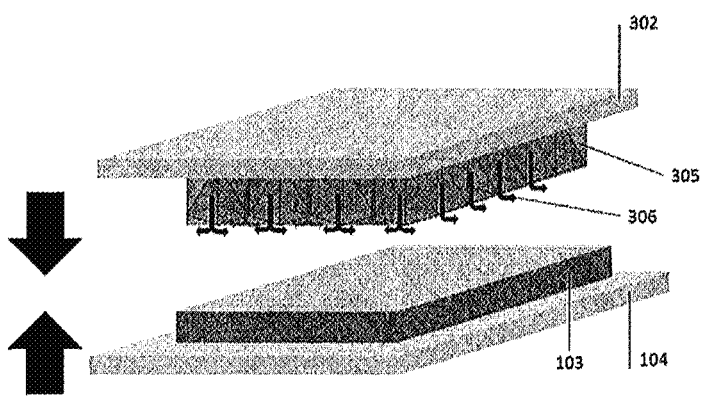

For inverted 3D textures or random 3D textures on the mold the air cannot escape, while pressing the mold 302 and substrate 104 together with imprint lacquer 103 in between as shown in FIG. 3b. This FIG. 3b depicts an inverted pyramid array 305 on the mold 302. If this pyramid area texture comes in contact with the imprint lacquer the air is trapped in the pockets and cannot escape. The air escape flow 306 is blocked by the imprint lacquer. This will result in incomplete replication, which is visual unappealing and will limit the functionality of the optical texture. For instance a pyramid array texture on a substrate, resulting from imprinting with an inverted pyramid array mold, will not have a sharp peak, due to an air bubble located in the top of the pyramid void.

Figure 4:
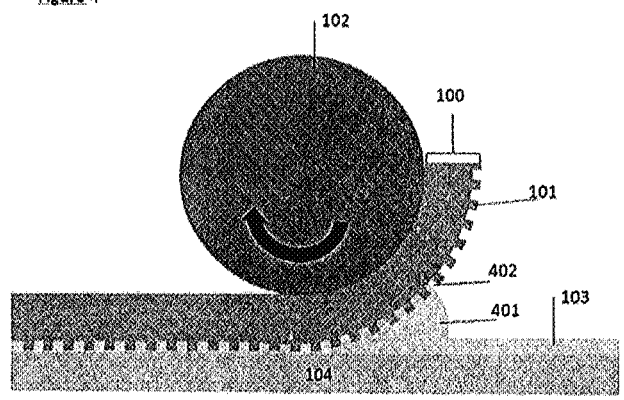
FIG. 4 schematically depicts the formation of a small front of lacquer by applying pressure on the roller and using a small surplus of lacquer.

As described in the process above air inclusions will be present in the start area for an imprint process with inverted 3D textures or random 3D textures on the mold. After lowering the first roller, a small front of lacquer 401 can be created by applying pressure on the roller and using a small surplus of imprint lacquer 103, as shown in FIG. 4. This lacquer front 401 will press the air out of the texture openings 402. The degree of air removal in inverted or random textures will depend on the texture shape, viscosity of lacquer and velocity of imprinting. Therefore after the start area, where the roller and mold have first contact with the resin, the air inclusion in the functional texture, i.e., in the functional area, can be controlled and prevented. However, said control and prevention of air inclusion in the functional layer is limited
  to texture shapes in the functional area which at given viscosity of the lacquer and at given velocity of imprinting allow fast enough air removal,
  to viscosities of the lacquer which have to be low enough so that at a given velocity of imprinting and at a given texture shape in the functional area the lacquer will flows fast enough into the openings, and to imprinting velocities which have to be low enough so that at a given texture shape in the functional area and at a given viscosity of the lacquer there is sufficient time for the lacquer to fill the openings of the functional area.

Figure 5:
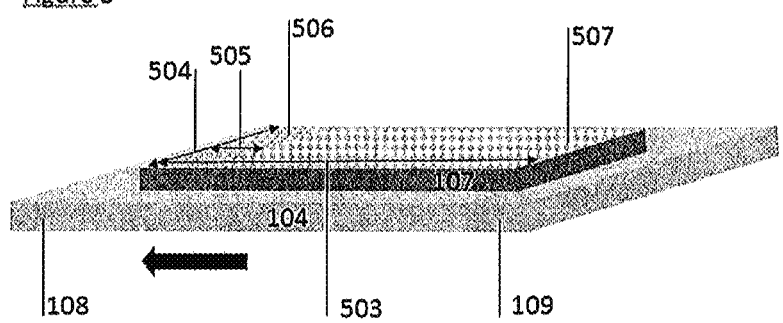
FIG. 5 schematically depicts an imprinted panel obtained by an imprinting process according to the prior art.

In FIG. 5 a schematic drawing is given of the imprinted panel with solidified imprint texture 107. For this example the imprint process with the imprint direction as indicated by the arrow, and defined in FIG. 1, the start of the imprint process is at the substrate start side 108. The imprint process ends at substrate end side 109. The functional textured area is defined by the length 503 and width 504. However, due to the air inclusion at the start of the process as a result of the mold touching the resin, the functional layer with good replication quality is reduced in size. There will be a start area 506 with air inclusion in the case of using inverted 3D imprint textures or random 3D imprint textures on the mold. The width of this start area will have the same width 504 as the width of the functional area 507. The length of the start area 505 is defined by the diameter of the roller and the contact area. The length of the start area can be between 0.1 to 50 millimeters. Commonly the length of the start area, with air inclusions, will be between 0.5 to 20 millimeters. This visual unappealing start area will be a part of the full functional area length 503.

In the drawing of FIG. 5, the panel is drawn with clear edges around the functional area. In principle the whole area can be imprinted, or any specific area can be coated and imprinted. For each case there will be air bubbles visible in the start area, where the roller and mold have first contact with the resin.

Figure 6:
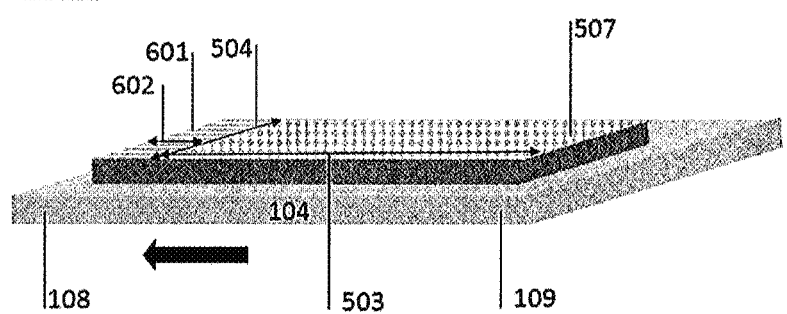
FIG. 6 schematically depicts an imprinted panel obtained by an imprinting process according to the invention.

To prevent such air bubbles a solution is to alter the texture of the mold and to add a lead-in area with a lead-in area texture for which air can escape. This lead-in area 601 is added before the functional layer 507, starting a controlled imprint process at the substrate start side 108, as shown in FIG. 6. The functional layer 507 will be imprinted with width 504 and length 503 as specified without air inclusion. The lead-in area will have a width which is the same as the width of the functional area 504 and a length 602. The length is defined by the diameter of the roller and the contact area. Typically the length of the lead-in area can be between 0.1 to 50 millimeters. Commonly the length of the lead-in area is between 1 to 20 millimeters. The lead-in area will have a different lead-in area texture compared with the texture of the functional area. The texture of the lead-in area on the mold has to be a texture for which air can escape and can be a flat surface, a shallow texture with texture height below 1 micron or a texture with channels, as for instance, but not limited, 2D textures as bars, lenticulars and gratings, and regular 3D textures as pyramids, blocks, pillars, cones and lenses.

As mentioned the texture of the lead-in area can be any texture with channels for which the air can escape. The height and/or depth of the texture can vary between the functional area and lead-in area on the mold. Moreover the same texture can be added to the other sides of the functional area for a symmetric visual appearance. Therefore, in a preferred embodiment the imprint texture comprises a lead-in area with a texture for which gas can escape on one side of the functional area starting the imprinting process, wherein one or more of the other sides of the functional area exhibit a texture for visual appearance, which texture for visual appearance is the same as the texture of the lead-in area.

There are certain textures which are preferred:
1) Lead-in area textures with micro or nano channels, for which the texture has the same track-pitch, shape and sizes as the texture in the functional area without channels. In this case the visual appearance is for a greater part preserved. An example is to combine an inverted pyramid array texture in the functional area 504 with an opposite non-inverted pyramid array texture in the lead-in area 601 with same track pitch, angle and height. Another example is to use 2D lenticulars in the lead-in area 601 with same track-pitch, lens height and lens curvature as the inverted lens texture in the functional area on the mold.
2) The lead-in area can have a shallow texture surface, with imprint texture height variation (i.e. the distance in height between the imprint texture openings and elevations) below 1 micron. Air bubbles will not be trapped between a flat resin surface and the shallow textured lead-in area of the mold.
3) The lead-in area can have a flat surface. Air bubbles will not be trapped between a flat resin surface and the flat lead-in area of the mold. In the case of a flat surface, the lead-in area will be transparent and less visible.
4) The lead-in texture, where the roller has first contact with the resin, can be used to add informative shapes like text, symbols, bar codes, logo's or figures. In this case in the lead-in area the inverted informative text will be a protruding texture on a flat area on the mold. Letters, numbers, symbols or figures which have a surrounded area, as for instance the letter o, will have air trapped in this surrounding area. These surrounded area should either be fully filled or have an air escape channel.

A further part of the present invention is a flexible stamp for roll-to-plate texturing or patterning discrete substrates with at least one roll, wherein the flexible stamp is flexible to an extend that it can be transported by the at least one roll, and wherein the flexible stamp comprises an imprint texture as its outer surface which imprint texture comprises a functional area which functional area is formed by openings and elevations thus creating volumes in the imprint texture, and wherein the flexible stamp is characterized in that the imprint texture comprises a starting area which is a lead-in area with a texture for which gas can escape followed by the functional area with a texture which is different from the texture of the lead-in area. Preferably, the flexible stamp exhibits a Young's Modulus between 0.1 Giga Pascal (GPa) and 10 Giga Pascal (GPa).

The invention claimed is:
1. A roll-to-plate process having at least one roll for texturing or patterning discrete substrates, the discrete substrates being displays, lighting or solar panels, wherein the roll-to-plate process comprises the steps of:
coating an imprint lacquer onto a surface of a discrete substrate supported on a platform;
pressing a mold, in a form of a flexible stamp, into the imprint lacquer on the discrete substrate supported on the platform, by pressing the mold with an imprint roller, the mold having a rear side and a front side, the rear side is in frictional contact with the imprint roller, and the front side exhibits an imprint texture with a lead-in area having a first texture from which gas can escape followed by a functional area with a second texture, the first texture is different from the second texture, and the functional area is formed by openings and elevations that create volumes in the imprint texture to obtain an imprinted lacquer;

whereby the imprint lacquer is textured on the discrete substrate.

2. The process of claim 1, wherein the lead-in area on the mold exhibits a texture comprising channels.

3. The process of claim 2, wherein the channels are in the shape of blocks, bars, pillars, lenticulars, gratings, regular pyramids, cones and/or lenses.

4. The process of claim 3, wherein the channels are organized in a particular manner, the particular manner including a logo, a text, a figure, a bar code, or a fiducial.

5. The process of claim 1, wherein the lead-in area has a shallow texture with imprint texture height variations below 1 micron.

6. The process of claim 1, wherein the lead-in area is a flat surface.

7. The process of claim 1, wherein the lead-in area has a length between 0.1 and 50 mm.

8. The process of claim 1, wherein the lead-in area has the same width as the functional area.

9. The process of claim 1, wherein the texturing or patterning is performed with a stamp.

10. The process of claim 9, wherein the stamp is rolled or is guided by rollers.

11. The process of claim 9, wherein the stamp is a flexible stamp having the imprint texture with the lead-in area as an outer surface of the stamp.

12. The process of claim 1, wherein the lead-in area has micro or nano channels.

13. The process of claim 1, wherein the imprint texture comprises the lead-in area with a texture for which gas can escape on one side of the functional area, and one or more of the other sides of the functional area exhibit a texture for visual appearance, which the texture for visual appearance is the same as the texture of the lead-in area.

14. The process of claim 1, wherein the first texture is a shallow texture surface with the imprint texture height variation below 1 micron, the imprint texture height variation is the distance in height between the imprint texture openings and elevations.

15. The process of claim 1, further comprising curing the imprinted lacquer to obtain a solidified textured or patterned layer.

16. The process of claim 15, wherein the curing is performed thermally and/or by applying UV light.

17. The process of claim 1, wherein the lead-in area has a length between 1 and 20 mm.

* * * * *